United States Patent
Chang et al.

(10) Patent No.: US 7,097,921 B2
(45) Date of Patent: Aug. 29, 2006

(54) SANDWICH ARC STRUCTURE FOR PREVENTING METAL TO CONTACT FROM SHIFTING

(75) Inventors: Ching-Yu Chang, Hsinchu (TW); Yu-Lin Yen, Taipei (TW); Chin-Da Su, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 462 days.

(21) Appl. No.: 10/446,927

(22) Filed: May 29, 2003

(65) Prior Publication Data
US 2004/0241466 A1 Dec. 2, 2004

(51) Int. Cl.
*B32B 18/00* (2006.01)
(52) U.S. Cl. ...................................... 428/698
(58) Field of Classification Search ............... 428/446, 428/448
See application file for complete search history.

(56) References Cited

U.S. PATENT DOCUMENTS 5,242,860 A * 9/1993 Nulman et al. ............ 438/653
5,604,155 A * 2/1997 Wang ......................... 438/626
5,635,763 A * 6/1997 Inoue et al. ................ 257/763
6,201,271 B1 * 3/2001 Okutoh et al. .............. 257/295
6,410,986 B1 6/2002 Merchant et al.

OTHER PUBLICATIONS

Da-Ren Zhuang, *VLSI Technology*, Jul. 20, 2002, p. 667-668.

* cited by examiner

*Primary Examiner*—Jennifer C. McNeil
*Assistant Examiner*—Elizabeth Ivey
(74) *Attorney, Agent, or Firm*—Rabin & Berdo, P.C.

(57) ABSTRACT

A sandwich ARC structure for preventing metal to contact from shifting, the sandwich ARC structure comprising a first Ti layer formed on a metal laer and a first TiN layer formed on the first Ti layer. A second Ti layer is formed on the first TiN layer and a second TiN layer is formed on the second Ti layer. Wherein the sandwich ARC structure formed of first Ti/first TiN/second Ti/second TiN will reduces the tress between said metal layer and a dielectric layer formed below the metal layer.

8 Claims, 3 Drawing Sheets

SANDWICH ARC STRUCTURE FOR PREVENTING METAL TO CONTACT FROM SHIFTING

FIELD OF THE INVENTION

The present invention relates generally to a semiconductor technology, and more specifically, to a sandwich anti-reflection coating (ARC) for preventing a shift between the metal layer and the contact layer in the dielectric layer.

BACKGROUND OF THE INVENTION

The metal to contact alignment is also an important parameter for the manufacture of flash memory. The shift between the metal and contact can be observed by SEM and AEI REG data. Please refer to FIG. 1. This Figure shows the top view of a wafer 10 having a plurality of sub-area defined thereon. The device or circuits will be formed on the wafer. Please also refer to FIG. 2a to FIG. 2f. A metal layer 26 is formed over a dielectric layer 20 with a contact hole 22 filled with conductive material 24. The profile of the metal layer 26 will be changed by the stress between the metal 26 and the dielectric layer 20. Subsequently, a photoresist for patterning pattern will be formed over the metal layer 6. However, the lithography uses the metal profile for the alignment during the lithography procedure. The shifted metal profile provides incorrect information, thereby causing the photoresist pattern to shift from the predetermined location as shown in FIG. 2e. After the etching of the metal layer, the metal pattern will not be at the correct position as can be seen in FIG. 2f. Referencing the FIG. 1, from the SEM of the left and right side area, the contact is almost exposed by the metal pattern. This means that the shift caused by the stress between thereof is very serious. The issue will degrade the performance of the device. Therefore, what is required is a method for solving the problem.

SUMMARY OF THE INVENTION

A sandwich ARC structure for preventing metal to contact from shifting, the sandwich ARC structure comprising a first Ti layer formed on a metal layer and a first TiN layer formed on the first Ti layer. A second Ti layer is formed on the first TiN layer and a second TiN layer is formed on the second Ti layer. Wherein the sandwich ARC structure formed of first Ti/first TiN/second Ti/second TIN will reduce the stress between said metal layer and a dielectric layer formed below the metal layer. The thickness of the first Ti layer is about 10 to 200 angstroms. Wherein the thickness of the first TiN layer is about 10 to 300 angstroms. The thickness of the second Ti layer is about 10 to 200 angstroms. The thickness of the second TiN layer is about 10 to 300 angstroms.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE INVENTION

The present invention proposes a novel method to fabricate a semiconductor device includes but not limited to flash nonvolatile memory. In the sandwich ARC structure, Ti/TiN/Ti/TiN will be introduced. The typical shift between the metal to contact will be eliminated by the present invention. The detailed description is as follows.

A semiconductor substrate is provided for the present invention. In a preferred embodiment, a single crystal silicon substrate with a <100> crystallographic orientation is provided. A plurality of isolations are formed on the substrate. In general, field oxide (FOX) isolation or trench isolation techniques can be introduced to serve as the isolations. For example, the FOX regions can be formed via lithography and etching steps to etch a silicon nitride/silicon dioxide composition layer. After the photoresist is removed and wet cleaned, thermal oxidation in a steam environment is used to grow the FOX regions. A gate, poly and ILD patterns are formed sequentially for array cell. After performing a contact photo and etch process, W deposition and W CMP is processed for W plug. Al deposition is formed before the ARC film deposition, which both act as a metal film. After the formation of the metal line pattern, it is found that the metal line is not correctly overlapped to the contact layer, although the overlay data has been compensated by overlay mark at metal photo process. From the experience, the result shows that the Aluminum deposition temperature influence is small. At the range of plus/minus 100 degrees, the overlay shift issue can still be observed. When the ARC film atop on the Al film is skipped, the metal to contact has better overlay performance without center-edge difference. The overlay shift is raised by the ARC film stress that is mainly due to the TiN thin film.

Figure 1:
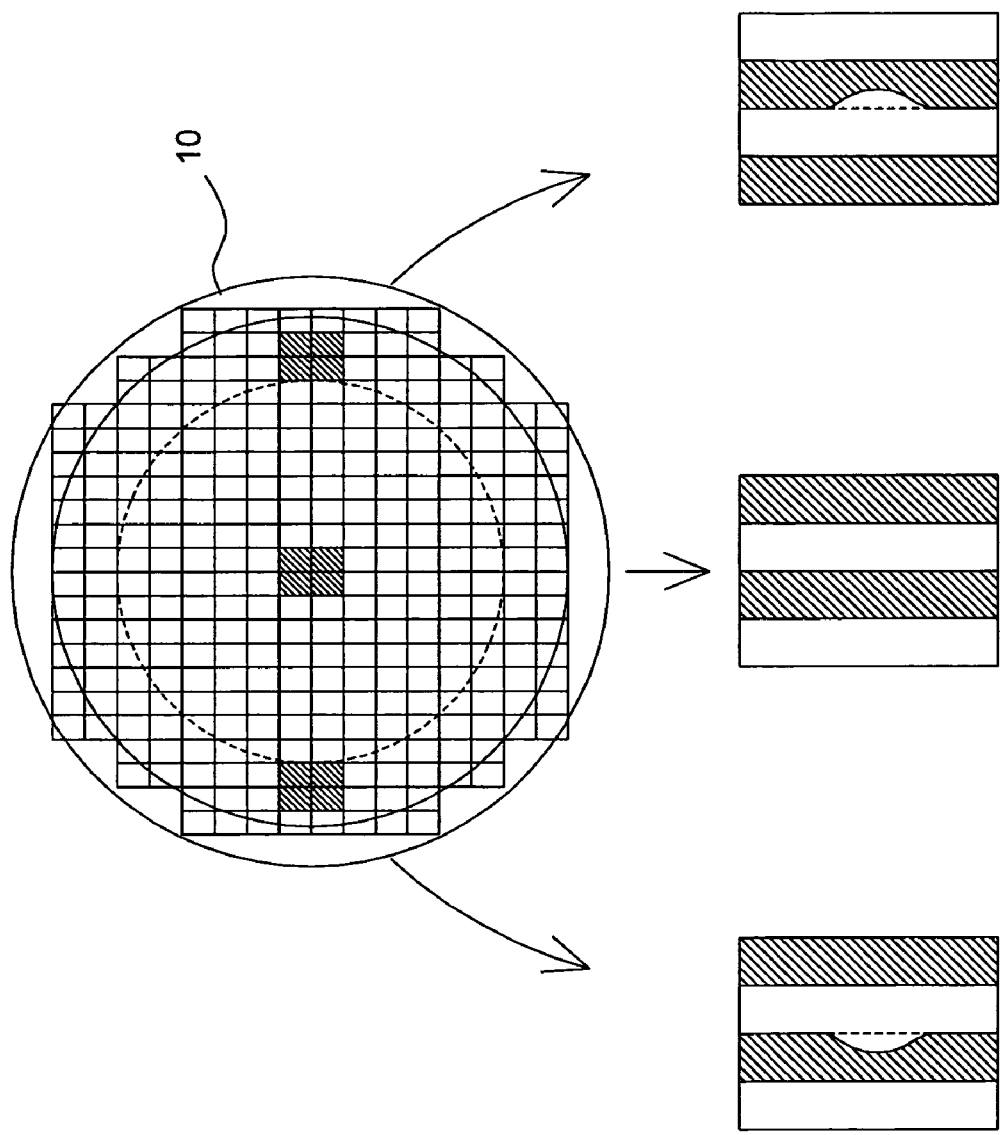
FIG. 1 is a top view of a semiconductor wafer illustrating the metal to contact overlay shift issue at the side area of the wafer according to the prior art.
Figure 2A:
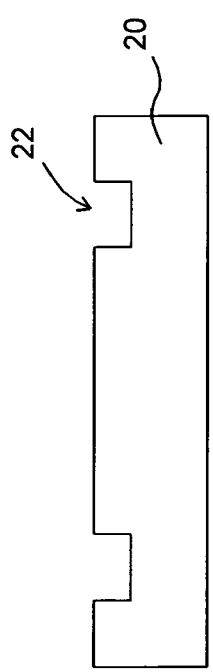
FIGS. 2a–2f are cross-sectional views of a semiconductor wafer illustrating the metal to contact overlay shift issue at the side area of the wafer according to the prior art.
Figure 2B:
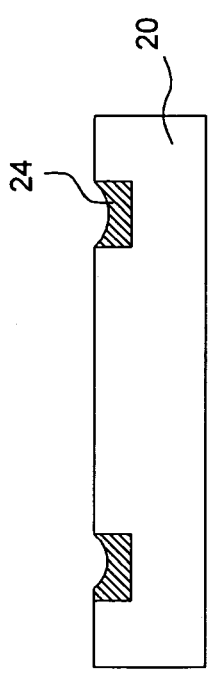
Figure 2C:
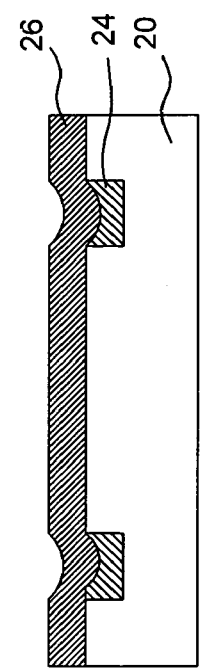
Figure 2D:
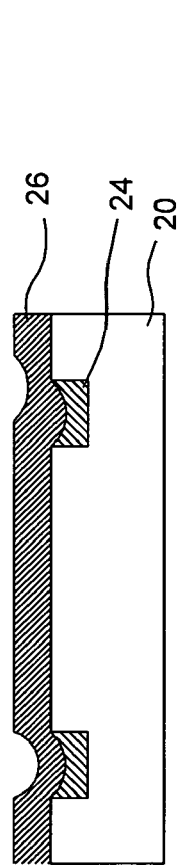
Figure 2E:
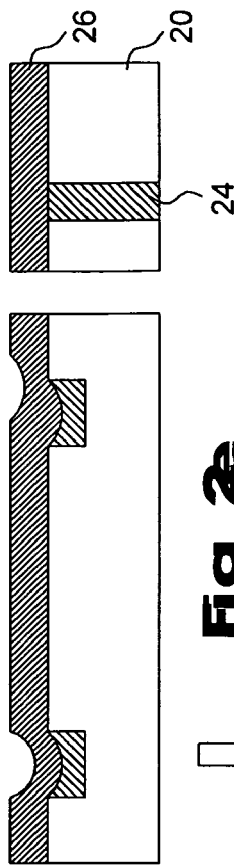
Figure 2F:
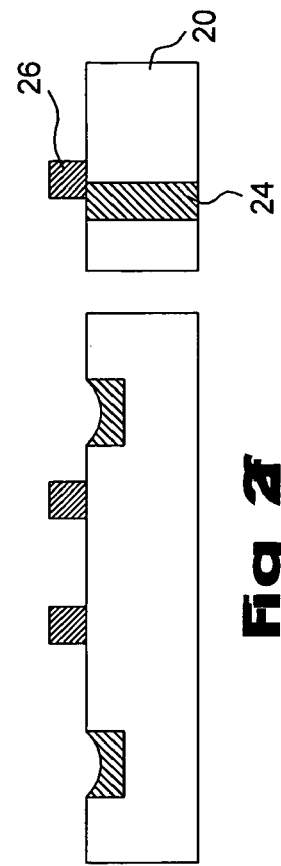
Figure 3:
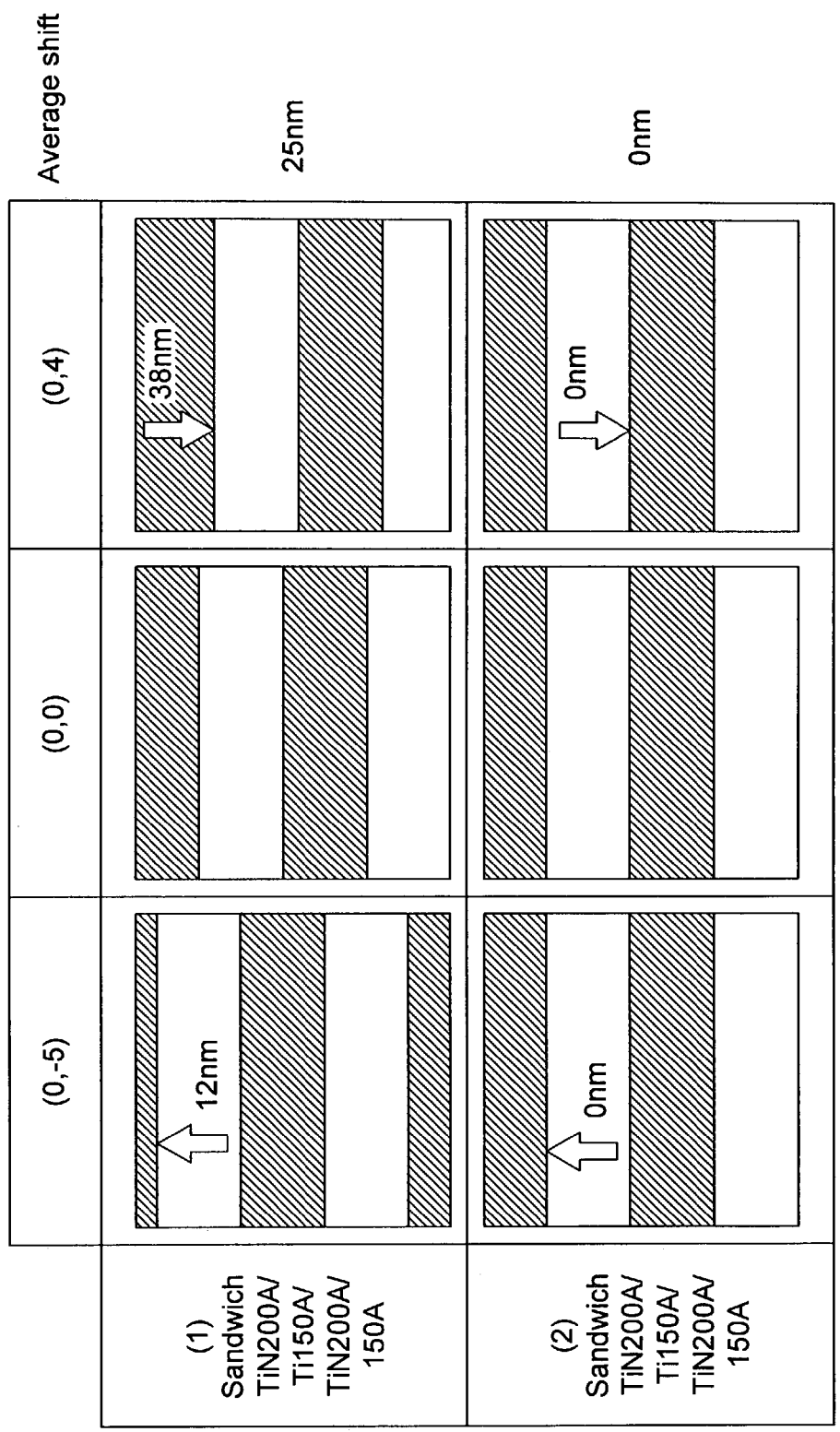
FIG. 3 is a top view of a semiconductor wafer illustrating the metal to contact overlay shift issue solved by the sandwich ARC structure according to the present invention.

The sandwich ARC structure is provided for reducing the shift from original 100 nm to less than 25 nm. FIG. 3 shows the top view of the wafer observed from the left, central and right area, respectively. The present invention sandwich ARC structure improves the shift problem. Namely, the metal to contact shift is reduced. The sandwich structure includes a lower Ti layer formed and a lower TiN layer having a thickness of about 10–300 angstroms. The thickness of the lower Ti layer is about 10–200 angstroms. An upper Ti layer having a thickness of about 10–200 angstroms is formed on the lower TiN layer. An upper TiN layer is formed on the Ti layer. The thickness is preferably 10–300 angstroms. The overlay shift enhancement mechanism could result from the ARC film stress that is mainly due to the TiN film. The improvement method according to the present invention is to introduce the sandwich structure including Ti/TiN/Ti/TiN.

As will be understood by persons skilled in the art, the foregoing preferred embodiment of the present invention is illustrative of the present invention rather than limiting the present invention. Having described the invention in connection with a preferred embodiment, modifications will now be apparent to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

What is claimed is:

1. A sandwich ARC structure for preventing a shift between a metal layer and a contact in a dielectric layer, said sandwich ARC structure comprising:
   a dielectric layer having a contact therein;
   a metal layer disposed on the dielectric layer;
   a first Ti layer formed on the metal layer;
   a first TiN layer formed on, and in direct contact with said first Ti layer;
   at least a second Ti layer formed on, and in direct contact with said first TiN layer; and
   at least a second TiN layer formed on, and in direct contact with said second Ti layer;
   wherein said sandwich ARC structure formed of first Ti/first TiN/second Ti/second TiN will reduce a stress between said metal layer and the dielectric layer formed below said metal layer.

2. The structure of claim 1, wherein the thickness of said first Ti layer is about 10 to 200 angstroms.

3. The structure of claim 1, wherein the thickness of said first TiN layer is about 10 to 300 angstroms.

4. The structure of claim 1, wherein the thickness of said second Ti layer is about 10 to 200 angstroms.

5. The structure of claim 1, wherein the thickness of said second TiN layer is about 10 to 300 angstroms.

6. A sandwich ARC structure for preventing a shift between a metal layer and a contact in a dielectric layer, said sandwich ARC structure comprising:
   a dielectric layer having a contact therein;
   a metal layer disposed on the dielectric layer;
   a first Ti layer having a thickness of about 10 to 200 angstroms formed on the metal layer;
   a first TiN layer having a thickness of about 10 to 300 angstroms formed on, and in direct contact with said first Ti layer;
   a second Ti layer having a thickness of about 10 to 200 angstroms formed on, and in direct contact with said first TiN layer; and
   a second TiN layer having a thickness of about 10 to 300 angstroms formed on, and in direct contact with said second Ti layer;
   wherein said sandwich ARC structure formed of first Ti/first TiN/second Ti/second TiN will reduce a stress between said metal layer and the dielectric layer formed below said metal layer.

7. The structure of claim 1, wherein the metal layer is an aluminum layer.

8. The structure of claim 6, wherein the metal layer is an aluminum layer.

* * * * *